United States Patent [19]

Rice et al.

[11] 4,217,468
[45] Aug. 12, 1980

[54] SPIRAL LINE OSCILLATOR

[75] Inventors: Johnnie W. Rice, Fredericksburg; Ronald J. Gripshover, King George; Millard F. Rose, Dahlgren; Richard C. Van Wagoner, Great Falls, all of Va.

[73] Assignee: The United States of America as represented by the Secretary of the Navy, Washington, D.C.

[21] Appl. No.: 592,136

[22] Filed: Jun. 30, 1975

[51] Int. Cl.³ .............................................. H01Q 1/04
[52] U.S. Cl. .................................. 178/116; 315/244; 320/1; 331/96; 343/701; 343/719
[58] Field of Search ............... 325/102, 105, 106, 108, 325/125, 128, 160; 315/240, 244; 317/7; 331/96, 99; 333/13, 82 B; 343/701, 719; 307/110; 320/1

[56] References Cited

U.S. PATENT DOCUMENTS

| | | | |
|---|---|---|---|
| 2,748,276 | 5/1956 | Gaffney et al. | 331/99 |
| 3,289,015 | 11/1966 | Fitch et al. | 307/110 |
| 3,500,208 | 3/1970 | Wickersham, Jr. et al. | 325/106 |
| 3,505,533 | 4/1970 | Bernstein et al. | 307/110 |
| 3,746,881 | 7/1973 | Fitch et al. | 307/110 |

OTHER PUBLICATIONS

"Novel Principle of Transient High Voltage Generation," Fitch & Howell, *Proceedings of IEE*, vol. III, No. 4, Apr. 1964.
"Marx-and Marx Like-High Voltage Generators," Fitch, *IEEE Transactions on Nuclear Science*, vol. NS18, No. 4, 1971.

*Primary Examiner*—Howard A. Birmiel

[57] ABSTRACT

A compact lightweight high power RF generator for use in military systems combines the principles of vector inversion transform systems with a RF tank circuit. The capacitively stored energy in the lines is discharged by means of high speed switching techniques with the energy store being a part of the tuned circuit.

9 Claims, 4 Drawing Figures

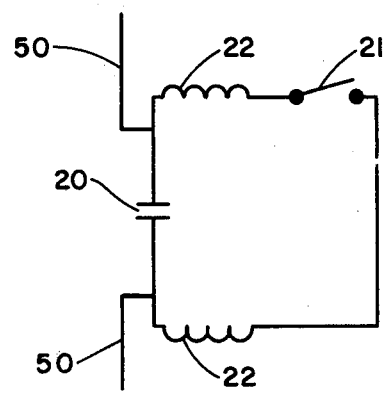
FIG 2
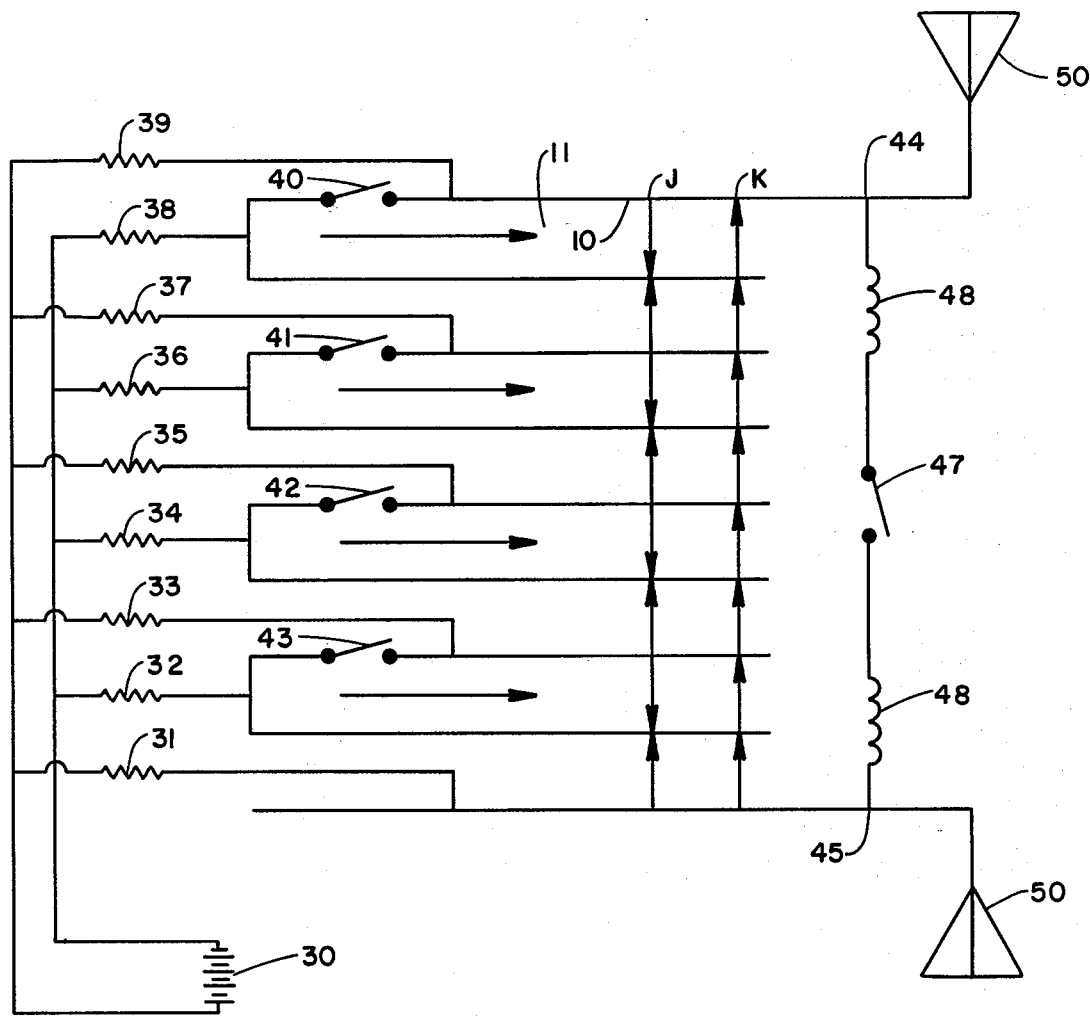

SPIRAL LINE OSCILLATOR

BACKGROUND OF THE INVENTION

For the most part, high power RF generators are large, heavy and usually need large external power supplies to drive them. Many of these generators require large auxiliary power supplies for filament circuits. There has been an increased interest in the use of Hertzian or spark transmitters as a means of generating extreme power levels because of geometric simplicity as well as inherent limitations on electron beam devices. They are usually limited in size and power due to the need for extremely high voltage supplies and a general lack of suitable dielectric materials.

Current vacuum tube transmitters in this frequency range are limited to peak powers in the 100 megawatt range and weigh several tons. Hertzian generators operating in the same frequency range need large high voltage power supplies, have severe insulation difficulties or require complicated multiple switching to satisfactorily perform. These transmitters also have constraints placed upon them which tend to limit energy storage, operating frequency, efficiency and pulse characteristics.

SUMMARY OF THE INVENTION

This invention combines the principles of vector inversion transform systems as described by Fitch and Howell ("Novel Principle of Transient High Voltage Generation", Proc. IEE, Vol. III, Apr. 4, 1964) with a tuned circuit to provide a small, compact lightweight power source of high voltage at radio frequencies and for a wide range of frequencies.

A vector-inversion generator is connected in such a way as to be part of a tuned circuit thereby producing an oscillatory discharge device. The frequency of oscillation is determined by the output capacitance and the inductance of the tuned circuit. The RF energy can be radiated through an antenna into space or transferred by direct injection to a system.

BRIEF DESCRIPTION OF THE DRAWINGS

FIG. 2 is an equivalent circuit diagram of FIG. 1 when the generator is erected.

FIG. 3 is a linear stacked stripline multiswitch oscillator.

DETAILED DESCRIPTION OF THE INVENTION

Figure 1:
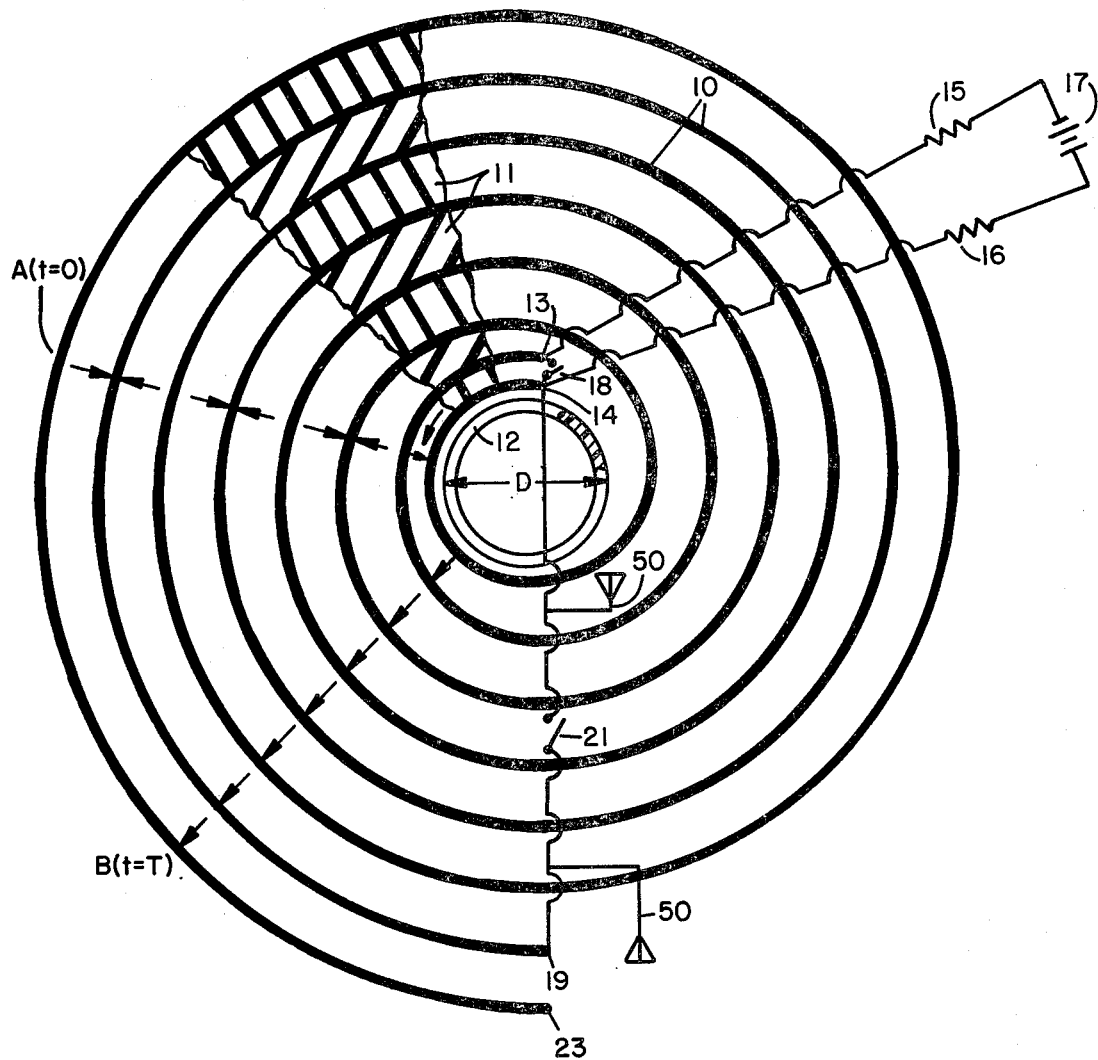
FIG. 1 is a schematic of a spiral line oscillator.

The principle of vector inversion, in the electrical sense, is to employ high speed switching, or other transient phenomena; to transpose electric vectors associated with electrostatic storage devices from series opposition to series addition. As shown in FIG. 1, the basic spiral high voltage generator operates by producing a transient process which inverts alternate E (electric field) vectors in a statically charged array. The spiral generator is essentially a self-contained, high voltage, pulse generator possessing the attributes of fast risetime, low output impedance and compactness.

If a parallel plate capacitor, having a length to width ratio which is much greater than one, is wound into a coil, it is necessary to insulate between turns to prevent short circuiting. If the insulator is the same material and thickness as that of the capacitor dielectric, twin spiral lines are obtained which have common conductors, a high degree of capacitive coupling and a high value of the inductive coupling coefficient. A schematic diagram of such a spiral is shown in FIG. 1, where a tightly wound n-turn spiral is formed by winding alternating layers of metal shim or foil 10 with dielectric sheets 11 on to an insulating core, such as a plastic former 12, which is typically cylindrical and usually hollow, having diameter D. The ends of the spiral are labeled 13, 14,19,23 hereafter termed terminals 13,14,19,23. At this stage it closely resembles a conventional capacitor winding; in its rest state, in fact, it is a capacitor with a conventional capacitance, which is charged to the starting voltage. The spiral line is charged to some voltage at terminals 13 and 14 through isolating resistors 15 and 16 by the power supply 17.

When the spiral line is charged initially to some value $V_O$, at $t=0$, the electric field vectors E are as shown in FIG. 1 at A. The vectors are in series opposition so that the summation over the line is zero, that is, the line is electrically neutral, with scalar potentials not exceeding $V_O$. If terminals 13 and 14 are short circuited by means of high speed spark gap techniques, such as a high speed, low impedance switch 18, then the closure of the switch transfers no energy outside the system, but rather transforms it inside. The switch creates a wave which spirals outward through one line only and since a switch (ideally) cannot absorb energy, no transfer takes place. The effect is an electromagnetic wave which propagates up the active line converting electrostatic energy in that line to electromagnetic energy. In the passive line the electric vectors are unaffected so that, when the wave reaches the end of the line, their sum (previously opposed by the equal and opposite sum of the vectors in the active, or switched, line) represents a voltage $nV_O$ between the innermost and outermost turns. If there is no termination at terminals 14 and 19, the wave will be reflected down the spiral, without a transfer of energy, transforming the electromagnetic energy back to electrostatic energy of opposite sign. All the electric vectors are now additive as shown at point B in FIG. 1. The summation over the line is n-times the magnitude of the individual vectors which result in a potential difference of $(2n-1)V_O$ between terminals 14 and 19, where n is the number of turns of the spiral. The wave reflected from the switch reverses the process until, at its second return, the ideal system is restored to its original state in a time $2\tau$, where $\tau$ is the risetime equal to the to-and-fro time of one line. Ideally, the process would repeat itself until internal loss mechanisms account for all the energy initially stored in the system capacitance.

Referring to FIG. 2 which is an equivalent circuit for FIG. 1 when the generator is erected, if the initial line capacitance is $C_T$, the output capacitance represented by capacitor 20 (measured between terminals 14 and 19 of the spiral) is $C_o \cong C_T/(2n-1)^2$. The generator can then be regarded as a self-pulse-charged, high-voltage capacitor. Its usefulness is in proportion to its ability to deliver its energy while it is near the peak of its excited state; in other words, the characteristic time of the generator-cum-load circuit must be short compared with the generator risetime.

A high voltage switch 21 is connected across terminals 14 and 19 as shown in FIG. 1. The high pressure spark gap 21 is fired when the potential difference between the ends or terminals 14 and 19 is near its maximum value. At that time, the equivalent circuit is simply one of the erected capacitance, shunted by the high voltage switch 21 between terminals 14 and 19. In the equivalent circuit of FIG. 2, the inductor 22 is the lumped inductance in the system, composed of the internal inductance of the spiral, switch leads and spark gap inductance. The device shown in FIG. 2 is then an oscillating tank circuit which oscillates at a frequency determined by the output capacitance 20 and inductor 22. This implies that spiral oscillators can be built which will oscillate at any frequency. An antenna 50 can be connected to the generator so as to radiate the RF energy being produced.

Referring to FIG. 3, a series of n parallel transmission lines are formed with metal shim or foil 10 and dielectric sheets 11 to produce n active and n inactive lines as shown. The lines are charged to $V_o$ by the power supply 30 through resistors 31 through 39. This gives a field vector diagram as shown schematically at J where time, $t=0$. When switches 40,41,42, and 43 are closed simultaneously the field vectors will align at K when $t=2\beta$, where $\beta$ is the one way transit time of the electromagnetic wave in the line. The output voltage between terminals 44 and 45 is equal to $2nV_o$. The output capacitance is determined to be $C_o \cong C_S/(2n)^2$ where $C_S$ is the total capacitance of the array.

A switch 47 and inductors 48 are connected as shown in FIG. 3. Spark switch 47 is set to trigger when the output voltage between terminals 44 and 45 is equal to $2nV_o$. When switch 47 closes, the system breaks into oscillation and can be detected due to radiation from the antenna 50.

Figure 4:
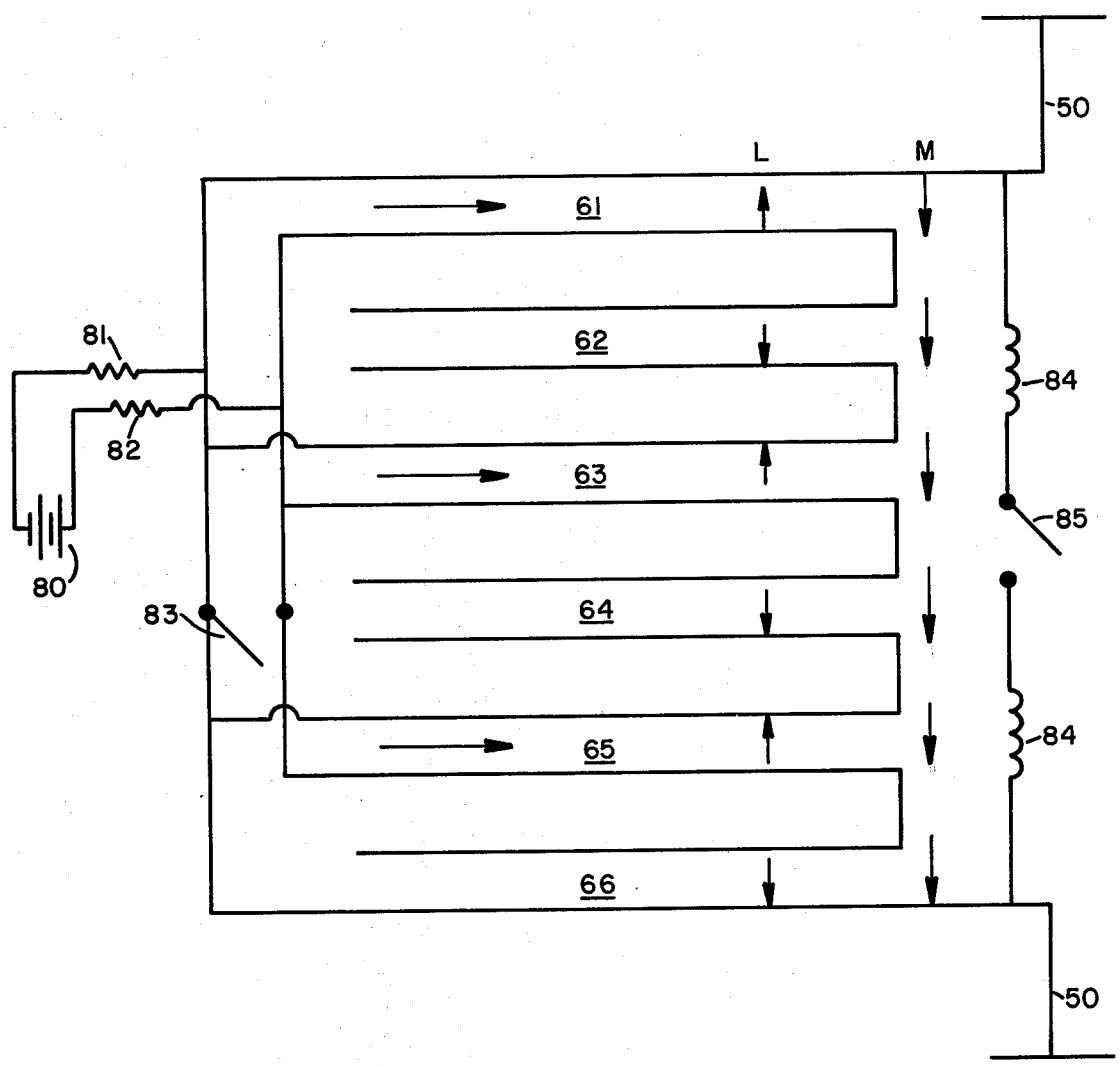
FIG. 4 is a linear stacked stripline single switch oscillator.

In FIG. 4, a series of active transmission lines 61,63,65 and passive transmission lines 62, 64 and 66 are shown. The line stack is charged to $V_o$ by the power supply 80 through resistors 81 and 82. The switch 83 closes at the time where $t=0$ where the existing field diagram is shown at L. An electromagnetic wave propagates in lines 61,63 and 65 as shown by the arrows in FIG. 4. At a time when $t=2\beta$ where $\beta$ is the one way transit time, vector inversion has occurred as shown at M. When the inductors 84 and switch 85 are connected as shown, and the switch is closed when the voltage is at maximum, the system breaks into oscillation.

Obviously many modifications and variations of the present invention are possible in light of the above teachings. It is therefore to be understood that within the scope of the appended claims the invention may be practiced otherwise than as specifically described.

What is claimed is:

1. A compact, lightweight RF power source comprising:
    a high-voltage, vector-inversion generator including a low impedance switch which when closed initiates vector inversion;
    at least one tuned inductor connected to one side of the high voltage output of said generator; and
    a high-speed switch interconnecting said inductor and the other side of the high voltage output of said generator for converting said generator and inductor into an RF source when the switch is closed.

2. The device of claim 1 wherein said vector-inversion generator is a spiral line generator.

3. The device of claim 1 wherein said vector-inversion generator is a multiswitch linear stacked stripline generator.

4. The device of claim 1 wherein said vector-inversion generator is a single switch linear stacked stripline generator.

5. The device of claim 1 including a means for delivering said RF energy operatively connected to said generator.

6. The device of claim 5 wherein said means for delivering RF energy is an antenna.

7. The device of claim 5 wherein said means for delivering RF energy operates by direct injection.

8. The device of claim 2 wherein said spiral line generator is a self-contained, high voltage pulse generator having a fast rise time and low output impedance.

9. The device of claim 8 wherein said spiral line generator comprises:
    an insulating core;
    twin transmission lines wound onto said core; and
    means to produce a transient high voltage across the ends of said transmission lines.

* * * * *